(12) United States Patent
Feng et al.

(10) Patent No.: US 10,535,583 B2
(45) Date of Patent: Jan. 14, 2020

(54) ELECTROSTATIC DISCHARGE PROTECTION DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Jun Hong Feng, Shanghai (CN); Zheng Hao Gan, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 33 days.

(21) Appl. No.: 15/407,290

(22) Filed: Jan. 17, 2017

(65) Prior Publication Data

US 2017/0229369 A1  Aug. 10, 2017

(30) Foreign Application Priority Data

Feb. 5, 2016 (CN) .......................... 2016 1 0083826

(51) Int. Cl.
*H01L 27/00* (2006.01)
*H01L 21/00* (2006.01)
(Continued)

(52) U.S. Cl.
CPC ...... *H01L 23/3735* (2013.01); *H01L 21/4882* (2013.01); *H01L 23/3677* (2013.01);
(Continued)

(58) Field of Classification Search
CPC ............ H01L 27/0292; H01L 27/0248; H01L 21/4882; H01L 23/3755
(Continued)

(56) References Cited

U.S. PATENT DOCUMENTS 6,316,827 B1  11/2001  Asano et al.
6,407,445 B1   6/2002  Vashchenko et al.
(Continued)

FOREIGN PATENT DOCUMENTS

CN           1212459 A       3/1999

OTHER PUBLICATIONS

European Patent Office (EPO) The Extended European Search Report for 17153216.1 dated Jun. 28, 2017 8 Pages.

*Primary Examiner* — Dale E Page
*Assistant Examiner* — Quovaunda V Jefferson
(74) *Attorney, Agent, or Firm* — Anova Law Group, PLLC

(57) ABSTRACT

An electrostatic discharge (ESD) protection device includes a substrate including a device region and an ESD protection structure formed on the substrate in the device region. The device region includes a center region and edge regions separated by the center region, while the ESD protection structure includes a plurality of gate structures. The ESD protection device also includes a dielectric layer formed to cover the plurality of gate structures and a plurality of heat dissipation structures formed on the dielectric layer with each heat dissipation structure aligned with a corresponding gate structure along a direction perpendicular to a surface of the substrate. The area size of each heat dissipation structure aligned with a corresponding gate structure in the center region is larger than the area size of each heat dissipation structure aligned with a corresponding gate structure in the edge region.

20 Claims, 4 Drawing Sheets

(51) Int. Cl.
    *H01L 23/373* (2006.01)
    *H01L 27/02* (2006.01)
    *H01L 21/48* (2006.01)
    *H01L 23/367* (2006.01)
    *H01L 29/423* (2006.01)
    *H01L 29/78* (2006.01)

(52) U.S. Cl.
    CPC ...... *H01L 27/0211* (2013.01); *H01L 27/0248* (2013.01); *H01L 29/4238* (2013.01); *H01L 29/78* (2013.01)

(58) Field of Classification Search
    USPC ........................................... 257/330
    See application file for complete search history.

(56) References Cited

U.S. PATENT DOCUMENTS

| | | | |
|---|---|---|---|
| 6,455,898 B1 * | 9/2002 | Liu | H01L 27/0266 |
| | | | 257/355 |
| 7,843,008 B2 * | 11/2010 | Okushima | H01L 27/0266 |
| | | | 257/355 |
| 2006/0284261 A1 | 12/2006 | Sriram | |
| 2015/0311191 A1 | 10/2015 | Weyers et al. | |
| 2018/0061823 A1 * | 3/2018 | Weyers | H01L 21/762 |

\* cited by examiner

ELECTROSTATIC DISCHARGE PROTECTION DEVICE AND FABRICATION METHOD THEREOF

CROSS-REFERENCES TO RELATED APPLICATIONS

This application claims the priority of Chinese Patent Application No. CN201610083826.8, filed on Feb. 5, 2016, the entire content of which is incorporated herein by reference.

FIELD OF THE DISCLOSURE

The present disclosure generally relates to the field of semiconductor fabrication technology and, more particularly, relates to electrostatic discharge protection devices and fabrication methods thereof.

BACKGROUND

As semiconductor chips become more and more widely used, more factors may cause electrostatic damage to semiconductor chips. In existing semiconductor chip designs, an electrostatic discharge (ESD) protection circuit is often adopted to reduce damages to semiconductor chips. Currently, the designs and the applications of existing ESD protection circuits include gate grounded NMOS (GGNMOS) protection circuit, shallow trench isolation (STI) diode protection circuit, gated diode protection circuit, laterally diffused MOS (LDMOS) protection circuit, bipolar junction transistor (BJT) protection circuit, etc.

FIG. 1 shows a schematic cross-section view of an existing GGNMOS protection circuit. Referring to FIG. 1, the ESD protection circuit includes a substrate 10, a P-type well region 11 formed in the substrate 10, a gate structure 12 formed on the surface of the P-type well region 11, an N-type source electrode 13 and an N-type drain electrode 14 formed in the P-type well region 11 on the two sides of the gate structure 12. The N-type source electrode 13, the P-type well region 1, and the N-type drain electrode 14 together form a parasitic NPN transistor. Specifically, the source electrode 13 is the emitter of the parasitic transistor, the drain electrode 14 is the collector of the parasitic transistor, and the P-type well region 11 is the base region of the parasitic transistor. Further, the source electrode 13, the P-type well region 11, and the gate electrode of the gate structure 12 are grounded, and an electrostatic voltage is applied to the drain electrode 14.

According to existing ESD device designs, because the electrostatic current may often be large, a number of transistors are usually used and connected in parallel with each other in order to improve the ESD protection ability of the device.

However, conventional ESD protection devices may still not be able to provide sufficient ESD protection. The disclosed electrostatic discharge protection devices and fabrication methods thereof are directed to solve one or more problems set forth above and other problems in the art.

BRIEF SUMMARY OF THE DISCLOSURE

One aspect of the present disclosure includes an ESD protection device. The ESD protection device includes a substrate including a device region. The device region further includes a center region and two edge regions separated by the center region. The ESD protection device also includes an ESD protection structure formed on the substrate in the device region, and the ESD protection structure further includes a plurality of gate structures. Moreover, the ESD protection device includes a dielectric layer formed to cover the plurality of gate structures and a plurality of heat dissipation structures formed on the dielectric layer with each heat dissipation structure aligned with a corresponding gate structure along a direction perpendicular to a surface of the substrate. The area size of each heat dissipation structure aligned with a corresponding gate structure in the center region is larger than the area size of each heat dissipation structure aligned with a corresponding gate structure in the edge region.

Another aspect of the present disclosure provides a method for fabricating an ESD protection device. The fabrication method includes providing a substrate including a device region and forming an ESD protection structure on the substrate in the device region. The device region further includes a center region and edge regions separated by the center region, while the ESD protection structure further includes a plurality of gate structures. The fabrication method also includes forming a dielectric layer to cover the plurality of gate structures and then forming a plurality of heat dissipation structures on the dielectric layer with each heat dissipation structure aligned with a corresponding gate structure along a direction perpendicular to a surface of the substrate. The area size of each heat dissipation structure aligned with a corresponding gate structure in the center region is larger than the area size of each heat dissipation structure aligned with a corresponding gate structure in the edge region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Existing ESD protection devices may not be able to provide sufficient ESD protection for semiconductor chips.

This may be because the transistors may not be uniformly switched and lack of operation uniformity.

Figure 1:
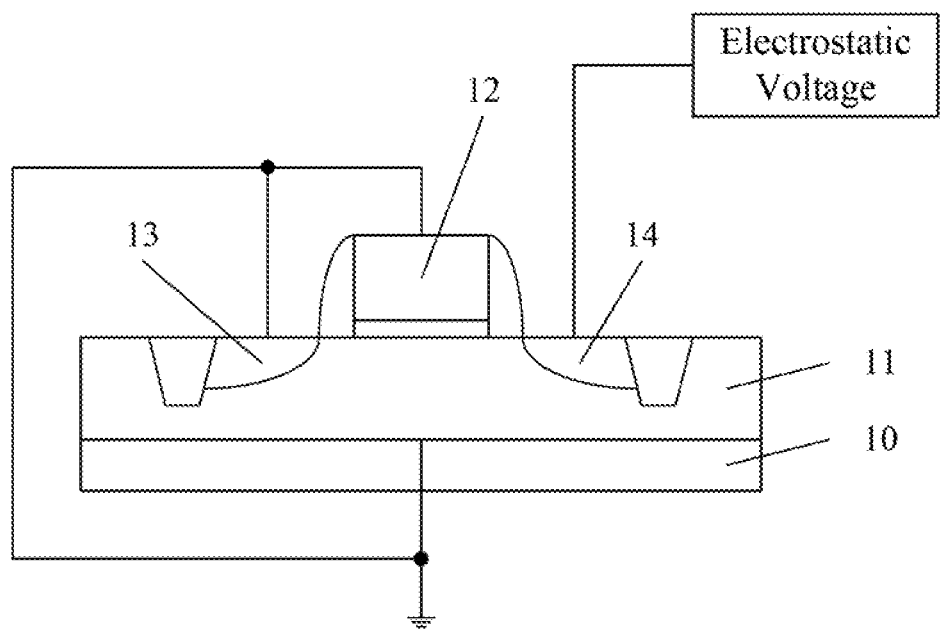
FIG. 1 illustrates a schematic cross-section view of an existing GGNMOS protection device.
Figure 2:
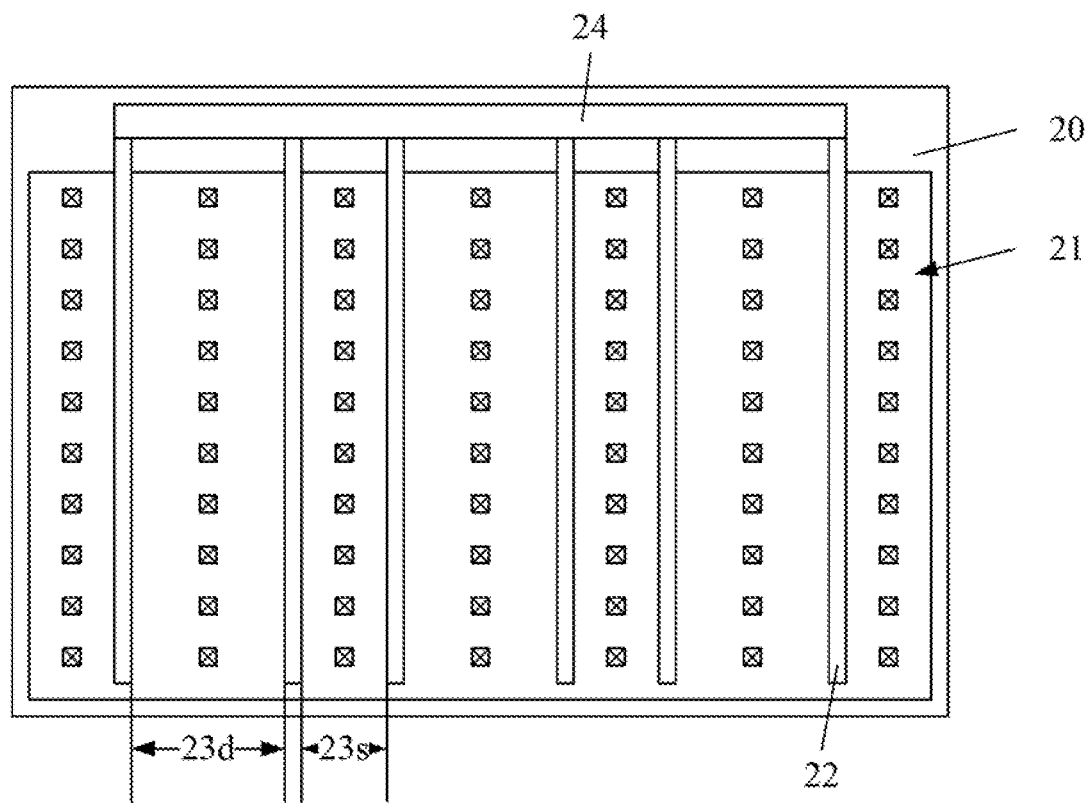
FIG. 2 illustrates a schematic top view of an existing ESD protection device.

FIG. 2 shows a schematic top view of an existing ESD protection device. For illustration purpose, the ESD protection device in FIG. 2 is a GGNMOS protection device including a plurality of N-type FETs.

Referring to FIG. 2, the ESD protection device is formed by a number of transistors that are connected in parallel with each other. Specifically, the ESD protection device includes a substrate 20. The substrate further includes a device region 21 and a connection layer 24. Further, the device region 21 includes a plurality of gate structures 22 and the plurality of gate structures 22 are arranged in parallel with each other. The device region 21 also includes a plurality of source regions 23s and a plurality of drain regions 23d formed on the two sides of the gate structures 22. Moreover, neighboring gate structures 22 share a source region 23s or a drain region 23d. That is, the plurality of source regions 23s and the plurality of drain regions 23d are formed alternately between neighboring gate structures 22. In addition, the gate structures 22 of the plurality of N-type FETs are grounded through the connection layer 24 in order to form the GGNMOS protection device.

Due to the consideration of layout design, the connection layer 24 used for grounding is often separated from the device region 21 in existing ESD protection devices. Therefore, the N-type transistors at different locations in the device region 21 may have different parasitic resistances. During the operation of the ESD protection device, heat generated from gate structures at different locations may be different and the temperature of gate structures at different locations may also be different, which may further lead to different threshold voltages for the N-type transistors at different locations. Therefore, the N-type transistors at different locations may not switch simultaneously, causing lack of operation uniformity and thus affecting the ESD ability of the ESD protection device.

Figure 3:
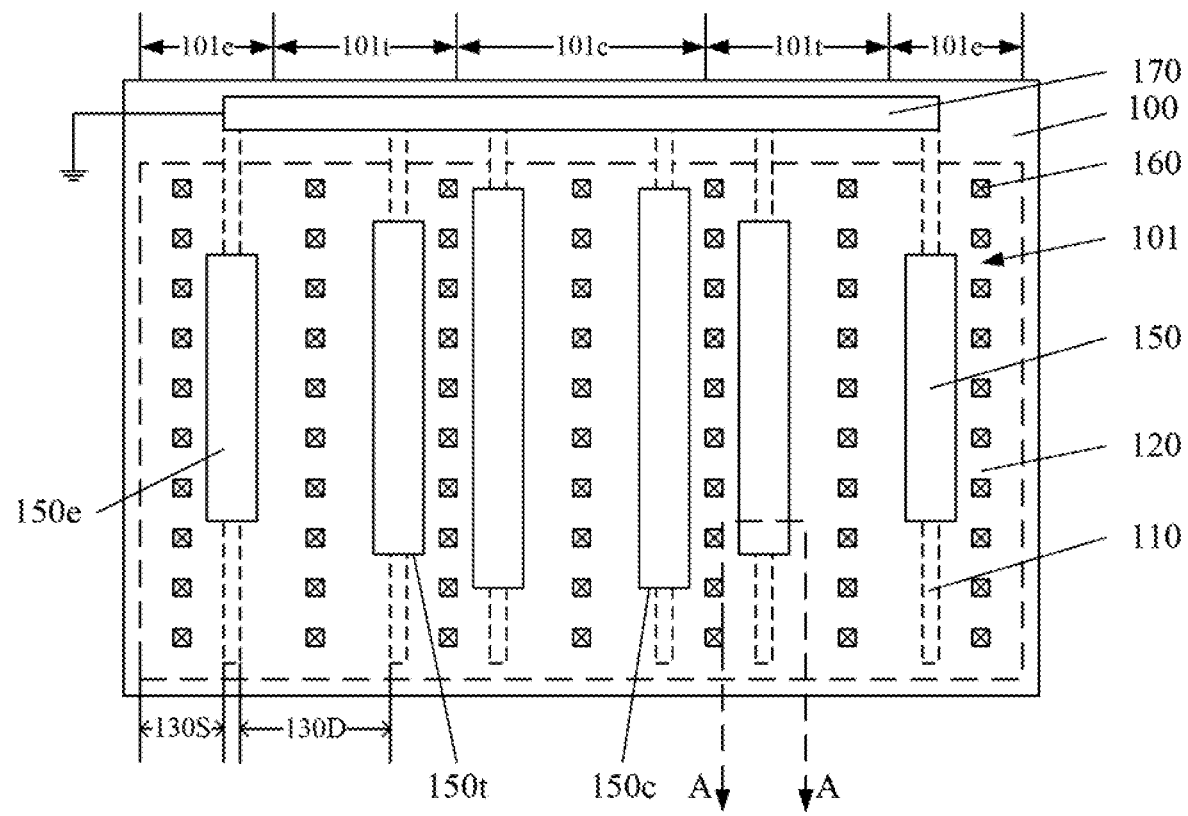
FIG. 3 illustrates a schematic top view of an exemplary ESD protection device consistent with disclosed embodiments.
Figure 4:
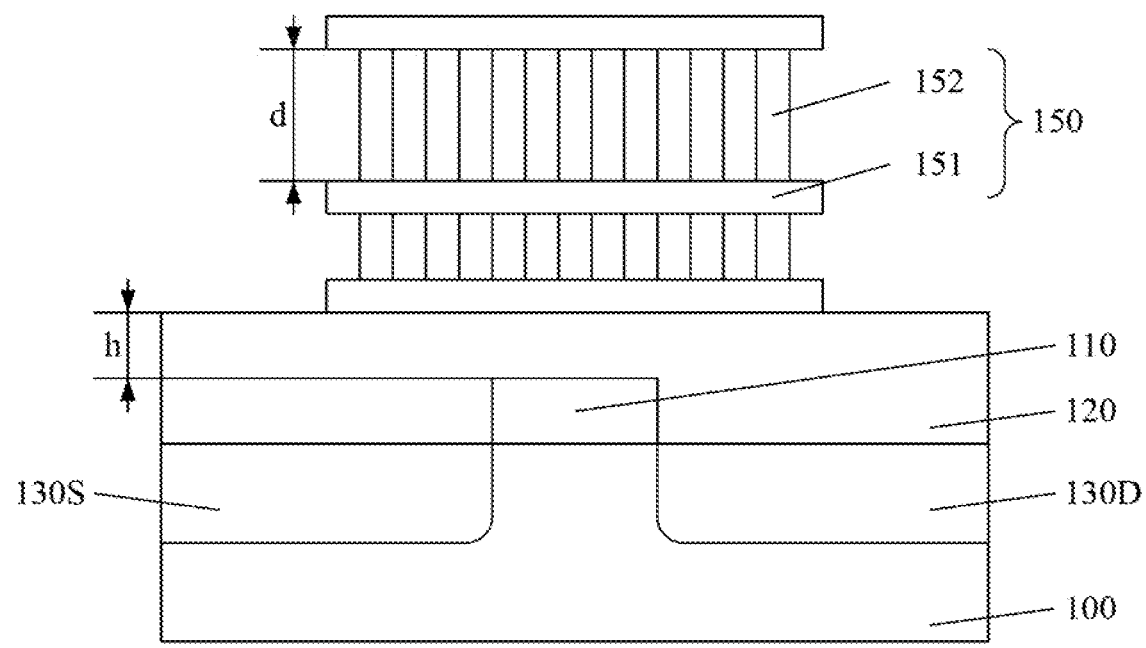
FIG. 4 illustrates a schematic cross-section view of the ESD protection device shown in FIG. 3 along an AA line.

The present disclosure provides an ESD protection device. FIG. 3 shows a schematic top view of an ESD protection device consistent with disclosed embodiments. FIG. 4 shows a schematic cross-section view of the ESD protection device shown in FIG. 3 along an AA line. For illustration purposes, the ESD protection device shown in FIG. 3 includes a plurality of GGNOMS-FETs, although any other types of semiconductor components/devices may be optionally or additionally included in the disclosed ESD protection device according to various embodiments of the present disclosure.

Referring to FIGS. 3-4, the ESD protection device may include a substrate 100. The substrate 100 may include a device region 101 used to form an ESD protection structure. A plurality of gate structures 110 may be formed on the surface of the substrate 100 in the device region 101, and a dielectric layer 120 may be formed to cover the plurality of gate structures 110.

The substrate 100 may be used to provide an operation platform for the semiconductor process. The region of the substrate 100 used to form the ESD protection structure may be the device region 101. The substrate 100 may be made of single crystalline silicon, polycrystalline silicon, or amorphous silicon. The substrate 100 may also be made of germanium, gallium arsenide (GaAs), or silicon germanium (SiGe). The substrate 100 may have a structure with an epitaxial layer or may be silicon on an epitaxial layer. Moreover, the substrate 100 may also be made of any appropriate semiconductor material. In one embodiment, the substrate 100 is made of silicon.

The device region 101 may be used to form an ESD protection structure. In one embodiment, the ESD protection structure formed in the device region 101 may be a GGNMOS protection device including a plurality of N-type FETs. Therefore, besides the plurality of gate structures 110, the substrate 100 may also include a plurality of source regions 130S and a plurality of drain regions 130D. In addition, because the ESD protection structure is a GGNMOS protection structure, the doping type of the FETs in the GGNMOS protection structure is N-type.

Each gate structure 110 together with a source region 130S and a drain region 130D may form an FET. Therefore, each gate structure 110 may be formed between a corresponding source region 130S and a corresponding drain region 130D. The gate structure 110 may be used to control the channel between the source region 130S and the drain region 130D switching from a 'switch-on' status to a 'cut-off' status, and vice versa. In addition, the plurality of gate structures 110 may also be connected to ground to release electrostatic charge. Specifically, the gate electrode of each gate structure 110 may be connected to the ground through a connection layer 170.

In one embodiment, neighboring gate structures 110 may share a common source region 130S or a common drain region 130D in order to improve the integration degree and reduce the size of the ESD protection device. That is, the plurality of source regions 130S and the plurality of drain regions 130D may be formed alternately in the interspace between neighboring gate structures 110.

In one embodiment, in a plane parallel to the surface of the substrate 100 and along a direction perpendicular to the length direction of the plurality of gate structures 110, the width of the drain regions 130D may be larger than the width of the source regions 130S in order to improve the operation uniformity of the ESD protection device.

Moreover, a plurality of gate structures 110 may be formed on the surface of the substrate 100 in the device region 101. In order to improve the protection ability of the ESD protection device, the plurality of gate structures 110 may be formed in parallel with each other.

One terminal of each gate structure 110 in the device region 101 may be connected to the connection layer 170 situated outside of the device region 101. Therefore, the plurality of gate structures 110 may simultaneously release electrostatic charges through the connection layer 170.

Further, a dielectric layer 120 may be formed to cover the plurality of gate structures 110. The dielectric layer 120 covering the plurality of gate structures may be used to electrically isolate different device layers. In one embodiment, the dielectric layer 120 may be made of $SiO_x$.

In a plane parallel to the surface of the substrate 100 and along the direction perpendicular to the length direction of the gate structures 110, the device region 101 may include a center region 101c and two edge regions 101e separated by the center region 101c. However, the connection layer 170 may extend along the direction perpendicular to the length direction of the plurality of gate structures 110. Therefore, transistors located at different locations may correspond to different parasitic resistances. As a result, during the operation of the ESD protection device, heat generated from gate structures 110 may be different at different locations and the temperature of gate structures 110 may also be different at different locations. Specifically, heat generated from gate structures 110 in the center region 101c may be more than heat generated from gate structures 110 in the edge region 101e so that the temperature at gate structures 110 in the center region 101c may be higher than the temperature at gate structure 110 in the edge region 101e. Therefore, the variation in the temperature of the gate structures 110 at different locations may further lead to different threshold voltage for the gate structures 110 at different locations and, thus, may affect the switching uniformity of the transistors during the operation of the ESD protection device.

Further, the ESD protection device may also include a plurality of heat dissipation structures 150 formed on the dielectric layer 120. The plurality of heat dissipation structures 150 may be situated above the plurality of gate structures 110. Specifically, the heat dissipation structures 150 formed above the gate structures 110 in the center region 101c may be first heat dissipation structures 150c while heat dissipation structures 150 formed above the edge regions 101e may be second heat dissipation structures 150e. The area size of each first heat dissipation structure 150c may be larger than the area size of each second heat dissipation structure 150e.

When the area size of the heat dissipation structure 150 is greater, heat generated from the gate structures 110 under the heat dissipation structure 150 may be more easily dissipated through the heat dissipation structure 150. In one embodiment, because the area size of the first heat dissipation structure 150c is larger than the area size of the second heat dissipation structure 150e, heat generated from the gate structures 110 under the first heat dissipation structures 150c may be more easily dissipated than heat generated from the gate structures 110 under the second heat dissipation structures 150e. That is, heat generated from the gate structures 110 in the center region 101c may be more easily dissipated than heat generated from the gate structures 110 in the edge regions 101e. As such, the heat dissipation structure 150 may be designed to have better heat dissipation ability for gate structures 110 that generate more heat. Therefore, the layout design of the heat dissipation structure 150 may help overcome the problem of having nonuniform temperature in gate structures 110 at different locations, and thus may avoid variation in the threshold voltage of the transistors due to nonuniform temperature. Therefore, the switching uniformity of the transistors during the operation of the ESD protection device may be improved.

In one embodiment, the device region 101 may also include a transition region 101t between the center region 101c and each edge region 101e. Accordingly, the gate structures 110 in the transition region 101t may be covered by a plurality of third heat dissipation structures 150t. The plurality of third heat dissipation structures 150t may be configured in parallel with the first heat dissipation structures 150c as well as the second heat dissipation structures 150e.

The area size of the third heat dissipation structure 150t may be smaller than the area size of the first heat dissipation structure 150c but larger than the area size of the second heat dissipation structure 150e. When the number of the third heat dissipation structures 150t formed between the center region 101c and each edge region 101e is more than one, the area sizes of the third heat dissipation structures 150t may gradually decrease along a direction from the center region 101c to the corresponding edge region 101e.

In one embodiment, in order to improve the heat dissipation ability of the first heat dissipation structure 150c and the performance of the ESD protection device, the area size of the first heat dissipation structure 150c may be designed as the largest area size under the design rules. Specifically, the design rules are rules describing the capability of semiconductor process. Moreover, the design rules may appear in forms of the smallest values allowed for geometric line-width, spacing, overlapping ratio of mask layers, etc. Therefore, the largest area size under the design rules is equivalent to the largest area size allowed within the capability of semiconductor process. In one embodiment, the area size of the first heat dissipation structure 150c may be designed as the largest area size allowed within the capability of semiconductor process.

In one embodiment, a plurality of gate structures 110 may be formed on the surface of the substrate 100 in the device region 101 and the plurality of gate structures 110 may be arranged in parallel with each other. Further, in one embodiment, each heat dissipation structure 150 may have a rectangular shape. Therefore, the plurality of heat dissipation structures 150 formed above the gate structures 110 may also be parallel with each other. Moreover, the plurality of heat dissipation structures 150 may also be parallel with the gate structures 110.

Further, the heat dissipation structures 150 may be made of metal. Metal is an ideal thermal conductor. Therefore, using a metal to form the heat dissipation structures 150 may effectively improve the heat dissipation rate, and thus improve the heat dissipation ability of the heat dissipation structures 150.

Referring to FIG. 4, the distance h between the heat dissipation structures 150 and the corresponding gate structures 110 may not be too large or too small. When the distance h between the heat dissipation structures 150 and the corresponding gate structures 110 is too large, heat generated from the gate structures 110 may not be easily conducted to the heat dissipation structure 150 and then be dissipated from the heat dissipation structure 150. Therefore, a large distance h between the heat dissipation structures 150 and the corresponding gate structures 110 may not be conducive to reducing the temperature of the gate structures 110. In one embodiment, the distance between the bottom of the heat dissipation structure 150 and the top of the corresponding gate structure 110 may be less than 150 nm to provide desired heat dissipation.

Referring to FIG. 4, the heat dissipation structure 150 may further include one of multiple heat dissipation layers 151. When the number of the heat dissipation layers 151 in each heat dissipation structure 150 is too small, the surface area of the heat dissipation structure 150 may be too small to improve the heat dissipation ability. However, when the number of the heat dissipation layers 151 in each heat dissipation structure 150 is too large, the structure of the heat dissipation structure 150 may become complicated, and thus the fabrication process for the heat dissipation structure 150 may be difficult. In one embodiment, the number of the heat dissipation layers 151 in each heat dissipation structure 150 may be in a range between 1 and 3.

The heat dissipation structure 150 may include multiple heat dissipation layers 151. Further, a small distance d between neighboring heat dissipation layers 151 may not help heat dissipation and thus may not be conducive to improving heat dissipation ability of the heat dissipation structure 150. However, a large distance d between neighboring heat dissipation layers 151 may increase the volume of the heat dissipation structure 150. In one embodiment, the distance between neighboring heat dissipation layers 151 may be smaller than 300 nm.

In one embodiment, the heat dissipation structure 150 may include three heat dissipation layers 151. The heat dissipation structure 150 may also include a plurality of thermal conductive plugs 152 formed between neighboring heat dissipation layers 151. The plurality of thermal conductive plugs 152 may be made of metal. Therefore, the heat transfer rate along a direction from the heat dissipation layer 151 close to the corresponding gate structure 110 to the heat dissipation layer 151 away from the corresponding gate structure 110 may be effectively improved, and thus the heat dissipation ability of the heat dissipation structures 150 may also be improved.

The number of thermal conductive plugs 152 in the first heat dissipation structure 150c may be larger than the number of thermal conductive plugs 152 in the second heat dissipation structure 150e. Therefore, the heat transfer rate in the first heat dissipation structure 150c may be larger than the heat transfer rate in the second heat dissipation structure 150e. Moreover, the area size of the first heat dissipation structure 150c may be larger than the area size of the second heat dissipation structure 150e, the heat dissipation structure 150c may demonstrate better ability in dissipating heat generated from the underneath gate structures 110 than the heat dissipation structure 150e. That is, heat generated from gate structures 110 in the center region 101c may be easier to be dissipated than heat generated from gate structures 110 in the edge region 101e. As such, difference in the temperatures of the gate structures 110 at different locations may be overcome and variation in the threshold voltages due to temperature differences may also be suppressed. Therefore, the switching uniformity of the transistors in the ESD protection device may be improved.

In one embodiment, the device region 101 may also include a transition region 101t between the center region 101c and each edge region 101e. Accordingly, the number of the thermal conductive plugs 152 in the heat dissipation structure 150 above the gate structures 110 may gradually decrease in the transition region 101t along a direction from the center region 101c to the corresponding edge region 101e.

In one embodiment, in order to improve the heat dissipation ability of the first heat dissipation structure 150c and the performance of the ESD protection device, the number of the thermal conductive plugs 152 in the first heat dissipation structure 150c may take the largest value under the design rules. As described above, the design rules are rules describing the capability of semiconductor process. Therefore, the largest number under of the thermal conductive plugs 152 according to the design rules in the first heat dissipation structure 150c is equivalent to the largest number of the thermal conductive plugs 152 allowed in the first heat dissipation structure 150c based on the capability of semiconductor process.

Further, in one embodiment, a plurality of connection plugs 160 may be formed in the substrate 110 of the device region 101. The plurality of connection plugs 160 may be used as inputs and/or outputs for electrostatic charges.

The connection plugs 160 formed in the substrate 100 of the device region 101 may be electrically connected to corresponding source regions 130S and/or drain regions 130D and may serve as inputs and/or outputs for electrostatic charges. In one embodiment, the ESD protection device may include a plurality of connection plugs 160. The plurality of connection plugs may be arranged along the length direction of the heat dissipation structures 150. Specifically, each heat dissipation structure 150 may have a rectangular shape and may be arranged in parallel with the gate structures 110; accordingly, the plurality of connection plugs 160 may also be arranged along the length direction of the heat dissipation structures 150.

Figure 5:
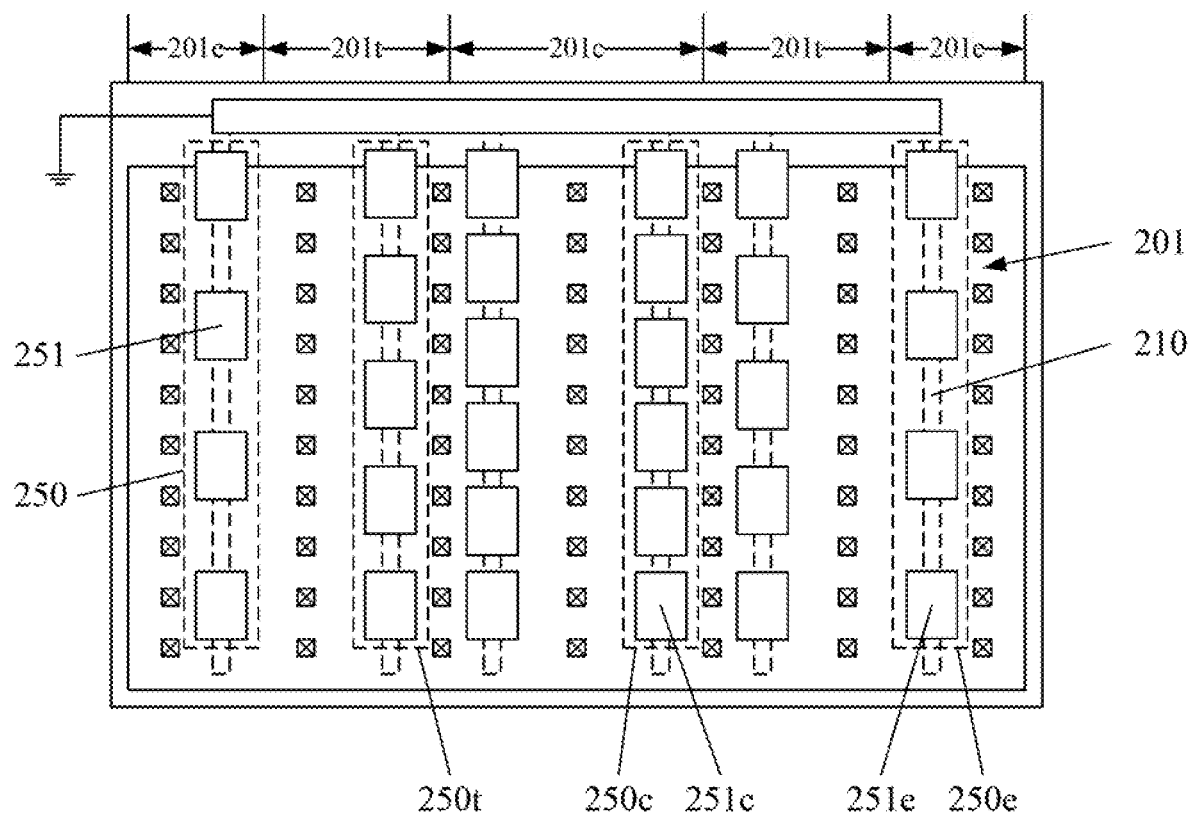
FIG. 5 illustrates schematic views of another exemplary ESD protection device consistent with disclosed embodiments.

FIG. 5 shows a schematic top view of another exemplary ESD protection device consistent with various disclosed embodiments. Referring to FIG. 5, the ESD protection device may include a substrate (not labeled). The substrate may further include a device region 201 and a connection layer (not labeled). A plurality of gate structures 210 may be formed on the surface of the substrate in the device region 201. A dielectric layer (not labeled) may be formed to cover the plurality of gate structures 210. A plurality of source regions (not labeled) and a plurality of drain regions (not labeled) may be alternately formed in the interspace between neighboring gate structures 210.

Compared to the ESD protection device shown in FIGS. 3-4, the ESD protection device shown in FIG. 5 includes a plurality of heat dissipation structures 250 with each heat dissipation structure 250 further including a plurality of equally-sized sub-structures 251. Referring to FIG. 5, the sub-structures 251 formed above the gate structures 210 in the center region 201c are first sub-structures 251c while the sub-structures 251 formed above the gate structures 210 in the edge region 201e are first sub-structures 251e. Each first heat dissipation structure 250c may be formed by a plurality of first sub-structures 251c and each second heat dissipation structure 250e may be formed by a plurality of second sub-structures 251e.

In one embodiment, the area size of the first heat dissipation structure 250c may be larger than the area size of the second heat dissipation structure 250e while the area size of each first sub-structure 251c may be equal to the area size of each second sub-structures 251e. Therefore, the number of the first sub-structures 251c in each first heat dissipation structure 250c may be larger than the number of the second sub-structures 251e in each second heat dissipation structure 250e.

Moreover, in one embodiment, the device region 201 of the ESD protection device may also include a transition region 201t between the center region 201c and each edge region 201e. Accordingly, the gate structures 210 in the transition region 101t may be covered by a plurality of third heat dissipation structures 250t. Similar to the first heat dissipation structures 250c and the second first heat dissipation structures 250e, each third heat dissipation structure 250t may be formed by a plurality of equally-sized sub-structures 251.

Further, the number of sub-structures 251 formed in each third heat dissipation structure 250t may be less than the number of first sub-structures 251c formed in each first heat dissipation structure 250c in the center region 201c, but more than the number of second sub-structures 251e formed in each second heat dissipation structure 250e in the edge region 201e.

For example, each first heat dissipation structure 250c in the center region 201c may include 6 first sub-structures 251c while each second heat dissipation structure 250e in the edge region 201e may include 4 second sub-structures 251e, the number of the sub-structures 251 to form a heat dissipation structure 250 in the transition region 201t may be 5.

Moreover, when the number of the third heat dissipation structures 250t formed between the center region 201c and each edge region 201e is more than one, the number of sub-structures 251t formed in the third heat dissipation structures 250t may decrease in the transition region 201t along a direction from the center region 201c to the corresponding edge region 201e.

In one embodiment, the density (and/or number) of sub-structures 251 formed on a gate structure 210 in the center region may be linearly decreased with increasing the distance between the corresponding gate structure 210 and the center of the device region 201c along the direction perpendicular to the length direction of the gate structure 210. That is, the density of the sub-structures 251 may reach a highest value in the center region 201c and may be linearly decreased as the position moves away from the center region 201c along the direction perpendicular to the length direction of the gate structures 210.

Further, the plurality of sub-structures 251 may be uniformly distributed over the gate structures 210 along the length direction of the gate structures 210 in order to improve the temperature uniformity of the gate structures 210. The plurality of sub-structures 251 may be arranged in a line along the length direction of the corresponding gate structure 210.

Referring to FIG. 5, the number of sub-structures 251 formed on the gate structures 210 may gradually decrease along the direction from the center region 201c to the edge region 201e. Therefore, the ability to dissipate heat generated from the gate structures 210 may also gradually decrease along the direction from the center region 201c to the edge region 201e. As such, difference in the temperatures of the gate structures 210 at different locations may be overcome and variation in the threshold voltages due to temperature differences may also be suppressed. Therefore, the switching uniformity of the transistors in the ESD protection device may be improved.

Figure 6:
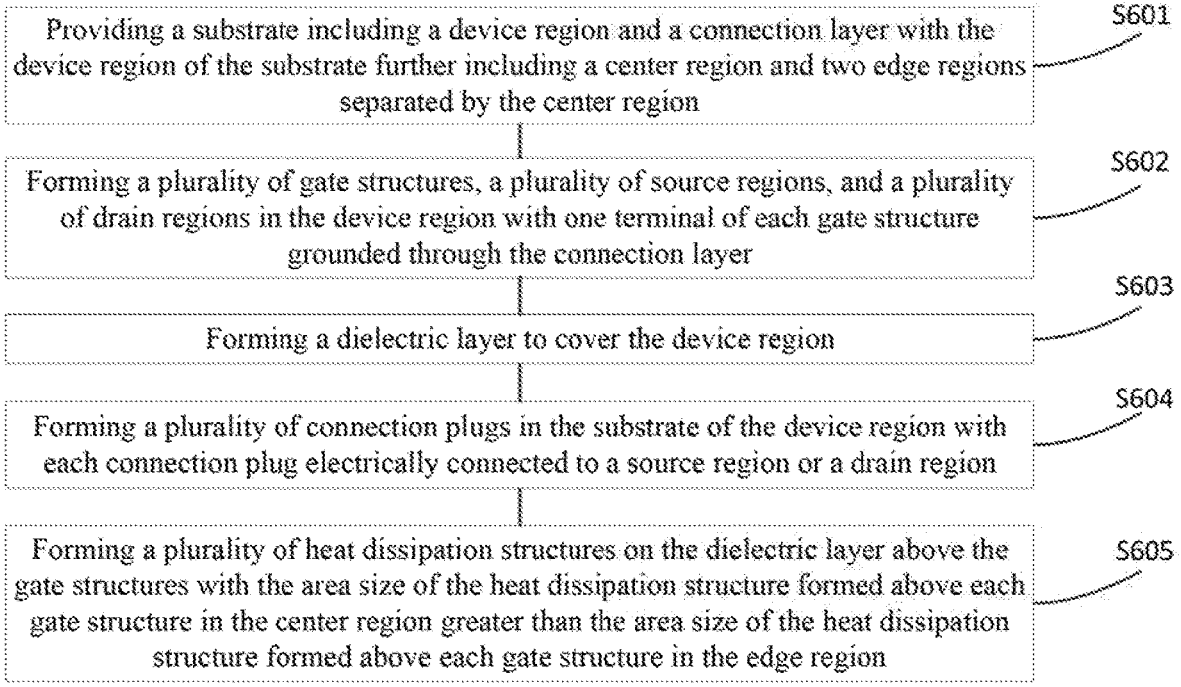
FIG. 6 illustrates a flowchart of the exemplary fabrication process for an ESD protection device consistent with disclosed embodiments.

The present disclosure also provides a method for fabricating an ESD protection device. FIG. 6 shows a flowchart of the fabrication process for the ESD protection device consistent with disclosed embodiments. FIG. 3 shows a schematic top-view of the ESD protection device and FIG. 4 shows a cross-section view of the structure shown in FIG. 3 along an AA line.

Referring to FIG. 6, at the beginning of the fabrication process, a substrate including a connection layer and a device region may be provided and the device region of the substrate may further include a center region and two edge regions separated by the center region (S601). Referring to FIG. 3, a substrate 100 including a device region 101 and a connection layer 170 may be provided. In one embodiment, the device region 101 of the substrate 100 may include a center region 101c and two edge regions 101e separated by the center region 101c. In other embodiment, the device region 101 may further include a transition region 101t between the center region 101c and each edge region 101e.

Referring to FIG. 6, a plurality of gate structures, a plurality of source regions, and a plurality of drain regions may be formed in the device region (S602). Referring to FIG. 3, a plurality of gate structures 110, a plurality of source regions 130S, and a plurality of drain regions 130D may be formed in the device region 101. Specifically, neighboring gate structures 110 may share a common source region 130S or a common drain region 130D. Therefore, the plurality of source regions 130S and the plurality of drain regions 130D may be alternately formed in the interspace between neighboring gate structures 110. In one embodiment, the gate structures 110 may be formed in both the center region 101c and the two edge regions 101e. In other embodiment, the device region 101 may also include a transition region 101t between the center region 101c and each edge region 101e; accordingly, the gate structures 110 may also be formed in the transition region 101t.

The plurality of gate structures 110, a plurality of source regions 130S, and a plurality of drain regions 130D may be formed in parallel with each other. That is, the length directions of the gate structures 110, the source regions 130S, and the drain regions 130D are all along one direction.

Further, returning to FIG. 6, a dielectric layer may be formed to cover the device region (S603). Referring to FIG. 4, the dielectric layer 120 may cover the plurality of gate structures 110, the plurality of source regions 130S, and the plurality of drain regions 130D.

In a subsequent process, a heat dissipation structure may be formed on the dielectric layer 120 above each gate structure 110. Therefore, the thickness of the dielectric layer 120 formed on each gate structure 110 may not be too large; otherwise, heat generated from the gate structures 110 may not be easily conducted to the heat dissipation structure. In one embodiment, the thickness of the dielectric layer 120 formed on each gate structure 110 may be less than 150 nm.

Returning to FIG. 6, further, a plurality of connection plugs may be formed in the substrate of the device region to electrically connect to the source regions and the drain regions (S604).

Referring to FIG. 3, a plurality of connection plugs 160 may be formed in the substrate 110 of the device region 101. Each connection plug 160 may be electrically connected to a corresponding source region 130S or a drain region 130D and serve as an input or an output for electrostatic charges. The plurality of connection plugs may be arranged along the length direction of the gate structures 110.

Further, returning to FIG. 6, a plurality of heat dissipation structures may be formed on the dielectric layer above the gate structures with the area size of the heat dissipation structure formed above each gate structure in the center region greater than the area size of the heat dissipation structure formed above each gate structure in the edge region (S605).

Referring to FIG. 3, a plurality of heat dissipation structures 150 may be formed on the dielectric layer 120 over the gate structures 110. Specifically, the heat dissipation structures 150 formed above the gate structures 110 in the center region 101c may be first heat dissipation structures 150c while heat dissipation structures 150 formed above the edge regions 101e may be second heat dissipation structures 150e. The area size of each first heat dissipation structure 150c may be larger than the area size of each second heat dissipation structure 150e.

When the area size of the heat dissipation structure 150 is bigger, heat generated from the gate structures 110 under the heat dissipation structure 150 may be more easily dissipated through the heat dissipation structure 150. In one embodiment, because the area size of the first heat dissipation structure 150 c is larger than the area size of the second heat dissipation structure 150e, heat generated from the gate structures 110 under the first heat dissipation structures 150c may be more easily dissipated than heat generated from the gate structures 110 under the second heat dissipation structures 150e. That is, heat generated from the gate structures 110 in the center region 101c may be more easily dissipated than heat generated from the gate structures 110 in the edge regions 101e. As such, the heat dissipation structure 150 may be arranged to have better heat dissipation ability for gate structures 110 that generate more heat. Therefore, the layout design of the heat dissipation structure 150 may help overcome the problem of having nonuniform temperature in gate structures 110 at different locations, and thus may avoid variation in the threshold voltage of the transistors due to nonuniform temperature. Therefore, the switching uniformity of the transistors during the operation of the ESD protection device may be improved.

In one embodiment, the device region 101 may also include a transition region 101t between the center region 101c and each edge region 101e. Accordingly, a plurality of third heat dissipation structures 150*t* may be formed over the gate structures 110 in the transition region 101*t*. The plurality of third heat dissipation structures 150*t* may be parallel to the first heat dissipation structures 150*c* as well as the second heat dissipation structures 150*e*.

The area size of the third heat dissipation structure 150*t* may be smaller than the area size of the first heat dissipation structure 150*c* but larger than the area size of the second heat dissipation structure 150*e*. When the number of the third heat dissipation structures 150*t* formed between the center region 101*c* and each edge region 101*e* is more than one, the area sizes of the third heat dissipation structures 150*t* may gradually decrease along a direction from the center region 101*c* to the corresponding edge region 101*e*.

In one embodiment, in order to improve the heat dissipation ability of the first heat dissipation structure 150*c* and the performance of the ESD protection device, the area size of the first heat dissipation structure 150*c* may be designed as the largest area size under the design rules. Specifically, the design rules are rules describing the capability of semiconductor process. Moreover, the design rules may appear in forms of the smallest values allowed for geometric linewidth, spacing, overlapping ratio of mask layers, etc. Therefore, the largest area size under the design rules is equivalent to the largest area size allowed within the capability of semiconductor process. In one embodiment, the area size of the first heat dissipation structure 150*c* may be designed as the largest area size allowed within the capability of semiconductor process.

In one embodiment, a plurality of gate structures 110 may be formed on the surface of the device region 101 in the substrate 100 and the plurality of gate structures 110 may be arranged in parallel with each other. Further, each heat dissipation structure 150 may have a rectangular shape. Therefore, the plurality of heat dissipation structures 150 formed above the gate structures 110 may also be parallel to each other and the heat dissipation structures 150 may also be parallel to the gate structures 110.

Moreover, the heat dissipation structures 150 may be made of metal. Metal is an ideal thermal conductor. Therefore, using a metal to form the heat dissipation structures 150 may effectively improve the heat dissipation rate, and thus improve the heat dissipation ability of the heat dissipation structures 150.

Referring to FIG. 4, the heat dissipation structure 150 may further include one of multiple heat dissipation layers 151. When the number of the heat dissipation layers 151 in each heat dissipation structure 150 is too small, the surface area of the heat dissipation structure 150 may be too small to improve the heat dissipation ability. However, when the number of the heat dissipation layers 151 in each heat dissipation structure 150 is too large, the structure of the heat dissipation structure 150 may become complicated, and thus the fabrication process for the heat dissipation structure 150 may be difficult. In one embodiment, the number of the heat dissipation layers 151 in each heat dissipation structures 150 may be in a range of 1 to 3.

The heat dissipation structure 150 may include multiple heat dissipation layers 151. Further, a small distance d between neighboring heat dissipation layers 151 may not help heat dissipation and thus may not be conducive to improving heat dissipation ability of the heat dissipation structure 150. However, a large distance d between neighboring heat dissipation layers 151 may increase the volume of the heat dissipation structure 150. In one embodiment, the distance between neighboring heat dissipation layers 151 may be smaller than 300 nm.

In one embodiment, the heat dissipation structure 150 may include three heat dissipation layers 151. The heat dissipation structure 150 may also include a plurality of thermal conductive plugs 152 formed between neighboring heat dissipation layers 151. The plurality of thermal conductive plugs 152 may be made of metal. Therefore, the heat transfer rate along a direction from the heat dissipation layer 151 close to the corresponding gate structure 110 to the heat dissipation layer 151 away from the corresponding gate structure 110 may be effectively improved, and thus the heat dissipation ability of the heat dissipation structures 150 may also be improved.

The number of thermal conductive plugs 152 in the first heat dissipation structure 150*c* may be larger than the number of thermal conductive plugs 152 in the second heat dissipation structure 150*e*. Therefore, the heat transfer rate in the first heat dissipation structure 150*c* may be larger than the heat transfer rate in the second heat dissipation structure 150*e*. Moreover, the area size of the first heat dissipation structure 150*c* may be larger than the area size of the second heat dissipation structure 150*e*, the heat dissipation structure 150*c* may demonstrate better ability in dissipating heat generated from the underneath gate structures 110 than the heat dissipation structure 150*e*. That is, heat generated from gate structures 110 in the center region 101*c* may be easier to be dissipated than heat generated from gate structures 110 in the edge region 101*e*. As such, difference in the temperatures of the gate structures 110 at different locations may be overcome and variation in the threshold voltages due to temperature differences may also be suppressed. Therefore, the switching uniformity of the transistors in the ESD protection device may be improved.

In one embodiment, the device region 101 may also include a transition region 101*t* between the center region 101*c* and each edge region 101*e*. Accordingly, the number of the thermal conductive plugs 152 in the heat dissipation structure 150 above the gate structures 110 may gradually decrease in the transition region 101*t* along a direction from the center region 101*c* to the corresponding edge region 101*e*.

In one embodiment, in order to improve the heat dissipation ability of the first heat dissipation structure 150*c* and the performance of the ESD protection device, the number of the thermal conductive plugs 152 in the first heat dissipation structure 150*c* may take the largest value under the design rules. As described above, the design rules are rules describing the capability of semiconductor process. Therefore, the largest number under of the thermal conductive plugs 152 the design rules in the first heat dissipation structure 150*c* is equivalent to the largest number of the thermal conductive plugs 152 allowed in the first heat dissipation structure 150*c* based on the capability of semiconductor process.

In another embodiment, referring to FIG. 5, each heat dissipation structure 250 formed on the dielectric layer above a corresponding gate structure 210 may include a plurality of equally-sized sub-structures 251. The sub-structures 251 formed above the gate structures 210 in the center region 201*c* are first sub-structures 251*c* while the sub-structures 251 formed above the gate structures 210 in the edge region 201*e* are first sub-structures 251*e*. Each first heat dissipation structure 250*c* may be formed by a plurality of first sub-structures 251*c* and each second heat dissipation structure 250*e* may be formed by a plurality of second sub-structures 251*e*.

The area size of the first heat dissipation structure 250*c* may be larger than the area size of the second heat dissipation structure 250e while the area size of each first substructure 251c may be equal to the area size of each second sub-structures 251e. Therefore, the number of the first sub-structures 251c in each first heat dissipation structure 250c may be larger than the number of the second sub-structures 251e in each second heat dissipation structure 250e.

Moreover, the device region 201 of the ESD protection device may also include a transition region 201t between the center region 201c and each edge region 201e. Accordingly, the gate structures 210 in the transition region 101t may be covered by a plurality of third heat dissipation structures 250t. Similar to the first heat dissipation structures 250c and the second first heat dissipation structures 250e, each third heat dissipation structure 250t may be formed by a plurality of equally-sized sub-structures 251.

Further, the number of sub-structures 251 formed in each third heat dissipation structure 250t may be less than the number of first sub-structures 251c formed in each first heat dissipation structure 250c in the center region 201c, but more than the number of second sub-structures 251e formed in each second heat dissipation structure 250e in the edge region 201e.

For example, each first heat dissipation structure 250c in the center region 201c may include 6 first sub-structures 251c while each second heat dissipation structure 250e in the edge region 201e may include 4 second sub-structures 251e, the number of the sub-structures 251 to form a heat dissipation structure 250 in the transition region 201t may be 5.

Moreover, when the number of the third heat dissipation structures 250t formed between the center region 201c and each edge region 201e is more than one, the number of sub-structures 251t formed in the third heat dissipation structures 250t may decrease in the transition region 201t along a direction from the center region 201c to the corresponding edge region 201e.

In addition, the density (and/or number) of sub-structures 251 formed on a gate structure 210 in the center region may be linearly decreased with increasing the distance between the corresponding gate structure 210 and the center of the device region 201c along the direction perpendicular to the length direction of the gate structure 210. That is, the density of the sub-structures 251 may reach a highest value in the center region 201c and may be linearly decreased as the position moves away from the center region 201c along the direction perpendicular to the length direction of the gate structures 210.

Further, the plurality of sub-structures 251 may be uniformly distributed over the gate structures 210 along the length direction of the gate structures 210 in order to improve the temperature uniformity of the gate structures 210. The plurality of sub-structures 251 may be arranged in a line along the length direction of the corresponding gate structure 210.

Referring to FIG. 5, the number of sub-structures 251 formed on the gate structures 210 may gradually decrease along the direction from the center region 201c to the edge region 201e. Therefore, the ability to dissipate heat generated from the gate structures 210 may also gradually decrease along the direction from the center region 201c to the edge region 201e. As such, difference in the temperatures of the gate structures 210 at different locations may be overcome and variation in the threshold voltages due to temperature differences may also be suppressed. Therefore, the switching uniformity of the transistors in the ESD protection device may be improved.

Compared to existing ESD protection devices, the disclosed ESD protection device may demonstrate advantages in improving the operation uniformity of the device.

Specifically, the disclosed ESD protection device may include a substrate including a device region used to form the ESD protection structure. The disclosed ESD protection device may further include a plurality of gate structures formed on the surface of the substrate in the device region and a dielectric layer formed to cover the plurality of gate structures. In a plane parallel to the surface of the substrate, the device region may further include a center region and two edge regions separated by the center region along a direction perpendicular to the length direction of the gate structures. The disclosed ESD may also include a plurality of heat dissipation structures formed on the surface of the dielectric layer in the device region. Each heat dissipation structure may be formed above a corresponding gate structure. Each heat dissipation structure formed on a gate structure in the center region is a first heat dissipation structure, while each heat dissipation structure formed on a gate structure in the edge region is a second heat dissipation structure. The area size of the first heat dissipation structure may be larger than the area size of the second dissipation structure.

According to the disclosed ESD protection device, by forming the plurality of heat dissipation structures on the surface of the dielectric layer above the gate structures, the ability of the ESD protection device to dissipate heat generated from the gate structures may be improved. Moreover, according to the disclosed ESD protection device, the heat dissipation structures formed over the gate structures in the center region of the device may be first heat dissipation structures while the heat dissipation structures formed over the gate structures in the edge region of the device may be second heat dissipation structures. Further, because the area size of the first heat dissipation structures may be larger than the area size of the second heat dissipation structures, heat generated from the gate structures in the center region may be more easily dissipated than heat generated from the gate structures in the edge regions. As such, the layout design of the heat dissipation structure in the ESD protection device may help overcome the problem of having nonuniform temperature in gate structures at different locations, and thus may improve the temperature uniformity for gate structures at different locations and also improve the uniformity in the threshold voltages of the transistors at different locations. Therefore, the switching uniformity of the transistors may be improved, and thus the performance of the formed ESD protection device may also be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An electrostatic discharge (ESD) protection device, comprising:
   a substrate including a device region, the device region including a center region at a center region of the ESD protection device, edge regions at edge regions of the ESD protection device separated by the center region, and a transition region between the center region and each edge region;

an ESD protection structure including a plurality of gate structures, formed on the substrate in the device region;

a dielectric layer formed to cover the plurality of gate structures;

a plurality of heat dissipation structures formed on the dielectric layer and each aligned with a corresponding gate structure along a direction perpendicular to a surface of the substrate, wherein:

an area size of each heat dissipation structure aligned with a corresponding gate structure in the center region is larger than an area size of each heat dissipation structure aligned with a corresponding gate structure in the edge region, and an area size of each heat dissipation structure aligned with a corresponding gate structure in the transition region gradually decreases along a direction from the center region to the edge region.

2. The ESD protection device according to claim 1, wherein the area size of the heat dissipation structure in the center region has a largest area size under design rules.

3. The ESD protection device according to claim 1, wherein the plurality of heat dissipation structures are made of metal.

4. The ESD protection device according to claim 1, wherein a distance between a bottom of the heat dissipation structure and a top of the corresponding gate structure is about 150 nm or less.

5. The ESD protection device according to claim 1, wherein each heat dissipation structure includes at least one heat dissipation layer configured in parallel with the surface of the substrate.

6. The ESD protection device according to claim 5, wherein about one to three heat dissipation layers are included in each heat dissipation structure.

7. The ESD protection device according to claim 5, wherein:

each heat dissipation structure includes multiple heat dissipation layers;

a distance between neighboring heat dissipation layers is less than 300 nm; and neighboring heat dissipation layers are connected with each other through a plurality of thermal conductive plugs.

8. The ESD protection device according to claim 7, wherein:

the plurality of thermal conductive plugs are made of metal.

9. The ESD protection device according to claim 7, wherein:

a number of thermal conductive plugs formed in each heat dissipation structure in the center region is greater than a number of thermal conductive plugs formed in each heat dissipation structure in the edge region.

10. The ESD protection device according to claim 9, wherein:

the device region further includes a transition region between the center region and each edge region; and a number of thermal conductive plugs formed in each heat dissipation structure above the gate structures in the transition region gradually decreases along a direction from the center region to the edge region.

11. The ESD protection device according to claim 9, wherein:

the number of thermal conductive plugs formed in each heat dissipation structure in the center region has a greatest number under design rules.

12. An electrostatic discharge (ESD) protection device, comprising:

a substrate including a device region, the device region including a center region and edge regions separated by the center region;

an ESD protection structure including a plurality of gate structures, formed on the substrate in the device region;

a dielectric layer formed to cover the plurality of gate structures;

a plurality of heat dissipation structures formed on the dielectric layer and each aligned with a corresponding gate structure along a direction perpendicular to a surface of the substrate, wherein:

an area size of each heat dissipation structure aligned with a corresponding gate structure in the center region is larger than an area size of each heat dissipation structure aligned with a corresponding gate structure in the edge region;

each heat dissipation structure includes a plurality of equally-sized sub-structures; and sub-structures in each heat dissipation structure aligned with a corresponding gate structure in the center region have a density greater than sub-structures in each heat dissipation structure aligned with a corresponding gate structure in the edge region.

13. The ESD protection device according to claim 12, wherein:

the device region further includes a transition region between the center region and each edge region; and a density of sub-structures in each heat dissipation structure aligned with a gate structure in the transition region gradually decreases along a direction from the center region to the edge region.

14. The ESD protection device according to claim 12, wherein:

the plurality of sub-structures are uniformly distributed above the gate structure along a length direction of the gate structure.

15. The ESD protection device according to claim 1, wherein:

the plurality of gate structures are arranged in parallel with each other.

16. The ESD protection device according to claim 1, including a gate grounded NMOS-FET device, including:

a plurality of source regions and a plurality of drain regions formed in the substrate of the device region, wherein each gate structure is situated between a source region and a drain region, and neighboring gate structures share a common source region or a common drain region; and a plurality of connection plugs each connecting to a source region or a drain region, wherein the connection plugs are arranged along a length direction of the heat dissipation structures and used as inputs or outputs for electrostatic charges.

17. A method for forming an ESD protection device, comprising:

providing a substrate including a device region, the device region including a center region at a center region of the ESD protection device, edge regions at edge regions of the ESD protection device separated by the center region, and a transition region between the center region and each edge region;

forming an ESD protection structure, including a plurality of gate structures, on the substrate in the device region;

forming a dielectric layer to cover the plurality of gate structures; and forming a plurality of heat dissipation structures on the dielectric layer and each aligned with a corresponding gate structure along a direction perpendicular to a surface of the substrate, wherein:

an area size of each heat dissipation structure aligned with a corresponding gate structure in the center region is larger than an area size of each heat dissipation structure aligned with a corresponding gate structure in the edge region, and an area size of each heat dissipation structure aligned with a corresponding gate structure in the transition region gradually decreases along a direction from the center region to the edge region.

18. The method for forming the ESD protection device according to claim 17, wherein the heat dissipation structures are made of metal.

19. The method for forming the ESD protection device according to claim 17, wherein the area size of the heat dissipation structure in the center region has a largest area size under design rules.

20. The method for forming the ESD protection device according to claim 17, wherein a distance between a bottom of the heat dissipation structure and a top of the corresponding gate structure is about 150 nm or less.

* * * * *